United States Patent
Ma

(10) Patent No.: US 10,026,496 B2
(45) Date of Patent: Jul. 17, 2018

(54) SHIFT REGISTER UNIT AND METHOD FOR DRIVING THE SAME, GATE DRIVE CIRCUIT AND DISPLAY DEVICE

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/322,346

(22) PCT Filed: Mar. 9, 2016

(86) PCT No.: PCT/CN2016/075976
§ 371 (c)(1),
(2) Date: Dec. 27, 2016

(87) PCT Pub. No.: WO2017/045380
PCT Pub. Date: Mar. 23, 2017

(65) Prior Publication Data
US 2017/0301407 A1     Oct. 19, 2017

(30) Foreign Application Priority Data

Sep. 18, 2015   (CN) .......................... 2015 1 0599758

(51) Int. Cl.
G11C 19/00     (2006.01)
G11C 19/28     (2006.01)
G09G 3/20      (2006.01)

(52) U.S. Cl.
CPC ............... *G11C 19/28* (2013.01); *G09G 3/20* (2013.01)

(58) Field of Classification Search
None
See application file for complete search history.

(56) References Cited

U.S. PATENT DOCUMENTS

2002/0075222 A1   6/2002   Miyatake
2014/0079175 A1*  3/2014   Wu ..................... G11C 19/28
                                                     377/72
(Continued)

FOREIGN PATENT DOCUMENTS

CN   1758321 A    4/2006
CN   1815545 A    8/2006
(Continued)

OTHER PUBLICATIONS

Second Office Action for Chinese Application No. 201510599758.6, dated Aug. 8, 2017, 6 Pages.

(Continued)

*Primary Examiner* — Long Nguyen
(74) *Attorney, Agent, or Firm* — Brooks Kushman P.C.

(57) ABSTRACT

A shift register unit and a method for driving the shift register unit, a gate drive circuit and a display device are provided. The shift register unit includes an inputting unit, an outputting unit, a reset unit, a first control unit and a second control unit, a first node, a second node, a third node, a shift signal outputting terminal and multiple inputting terminals. A width of a shift pulse output by the shift register unit may be adjusted by adjusting a width of a shift pulse input to the shift register unit, and the output shift pulse and the input shift pulse have an identical width.

20 Claims, 2 Drawing Sheets

(56) References Cited

U.S. PATENT DOCUMENTS

2015/0091783 A1    4/2015  Hwang
2016/0372042 A1*  12/2016  Ma .......................... G09G 3/20
2017/0200419 A1*  7/2017  Ma ....................... G09G 3/3266

FOREIGN PATENT DOCUMENTS

| CN | 101939791 A | 1/2011 |
|----|-------------|--------|
| CN | 102982846 A | 3/2013 |
| CN | 104134423 A | 11/2014 |
| CN | 104517561 A | 4/2015 |
| CN | 104537980 A | 4/2015 |
| CN | 104809978 A | 7/2015 |
| CN | 104835450 A | 8/2015 |
| CN | 105096808 A | 11/2015 |
| JP | 2001228830 A | 8/2001 |

OTHER PUBLICATIONS

PCT International Search Report and Written Opinion dated Jun. 14, 2016, Application No. PCT/CN2016/075976, 12 Pages.
First Office Action for Chinese Application No. 201510599758.6, dated Apr. 6, 2017, 7 Pages.

\* cited by examiner

SHIFT REGISTER UNIT AND METHOD FOR DRIVING THE SAME, GATE DRIVE CIRCUIT AND DISPLAY DEVICE

CROSS-REFERENCE TO RELATED APPLICATION APPLICATIONS

This application is the U.S. national phase of PCT Application No. PCT/CN2016/075976 filed on Mar. 9, 2016, which claims priority to Chinese Patent Application No. 201510599758.6 filed on Sep. 18, 2015, the disclosures of which are incorporated in their entirety by reference herein.

TECHNICAL FIELD

Field

The present disclosure relates to the field of display technology, and in particular, to a shift register unit and a method for driving the same, a gate drive circuit and a display device.

BACKGROUND

Continuous progresses are made to display technology and display device tends to be manufactured with high resolution and narrow borders. Gate Driver IC on Array (GOA) is a dominant approach for achieving narrow borders and high resolution of the display device.

A GOA circuit in related technologies generally includes multiple cascaded shift register units. Usually, an outputting unit of the shift register unit has an inputting terminal connected to a clock signal and outputs a high level shift pulse. The width of the high level shift pulse is the same as that of a high level pulse of the clock signal. In the case that the display device requires the shift pulse with a relatively large width, the display device cannot be driven by a gate drive circuit generated by such shift register units cascaded to each other.

SUMMARY

The present disclosure intends to provide a gate drive circuit with adjustable shift pulse width.

In a first aspect, the present disclosure provides a shift register unit, including an comprising an inputting unit, an outputting unit, a reset unit, a first control unit and a second control unit, a first node, a second node, a third node, a shift signal outputting terminal and a plurality of inputting terminals. The inputting unit is connected to a first inputting terminal, a second inputting terminal and the second node, and is configured to set a level at the second node identical to a level from the second inputting terminal in the case that a level from the first inputting terminal is an active level for the inputting unit. The first control unit is connected to a third inputting terminal, the first node and the second node, and is configured to be turned on in the case that the second node is at a low level and set a level at the first node identical to a level from the third inputting terminal, and maintain the level at the first node when the first node is in a floating state. The second control unit includes a first control module and a second control module. The first control module is connected to a fourth inputting terminal, a fifth inputting terminal, the first node and the third node, and is configured to be turned on in the case that the third node is at a low level and a level from the fourth inputting terminal is an active level for the first control module, and set the level at the first node identical to a level from the fifth inputting terminal. The second control module is connected to a sixth inputting terminal, a seventh inputting terminal, the second node and the third node, and is configured to set a level at the third node to be a high level in the case that the second node is at a low level and a level from the sixth inputting terminal is a high level, set the level at the third node identical to a level from the seventh inputting terminal in the case that the level from the sixth inputting terminal is a low level, and maintain the level at the third node when the third node is in a floating state. The outputting unit is connected to the shift signal outputting terminal and an eighth inputting terminal, and is configured to be turned on in the case that the first node is at a low level and set a level at the shift signal outputting terminal identical to a level from the eighth inputting terminal. The reset unit is connected to the second node, the shift signal outputting terminal and a ninth inputting terminal, and is configured to set the level at the shift signal outputting terminal identical to a level from the ninth inputting terminal in the case that the second node is at a low level, and maintain the level at the second node when the second node is in a floating state.

Optionally, the first inputting terminal and the sixth inputting terminal are an identical inputting terminal, and the active level for the inputting unit is a low level.

Optionally, the third inputting terminal and the eighth inputting terminal are an identical inputting terminal.

Optionally, the fifth inputting terminal and the seventh inputting terminal are an identical inputting terminal.

Optionally, the ninth inputting terminal and the fifth inputting terminal are an identical inputting terminal, or the ninth inputting terminal and the seventh inputting terminal are an identical inputting terminal.

Optionally, the fifth inputting terminal, the seventh inputting terminal and the ninth inputting terminal are an identical inputting terminal.

Optionally, the first control unit includes a first transistor and a first capacitor; the first transistor is a P type transistor, a source electrode thereof is connected to the third inputting terminal, a drain electrode thereof is connected to the first node and a gate electrode thereof is connected to the second node; and a first plate of the first capacitor is connected to the first node.

Optionally, a second plate of the first capacitor is connected to the third inputting terminal or the eighth inputting terminal.

Optionally, the first control module includes a second transistor and a third transistor. The second transistor is a P type transistor, a gate electrode thereof is connected to the third node, a drain electrode thereof is connected to the fifth inputting terminal and a source electrode thereof is connected to a drain electrode of the third transistor. A gate electrode of the third transistor is connected to the fourth inputting terminal and a source electrode thereof is connected to the first node.

Optionally, the third transistor is a P type transistor.

Optionally, the second control module includes a fourth transistor and a fifth transistor that are both P type transistors, and a second capacitor. A gate electrode of the fourth transistor is connected to the sixth inputting terminal, a drain electrode thereof is connected to the third node and a source electrode thereof is connected to the seventh inputting terminal. A gate electrode of the fifth transistor is connected to the second node, a drain electrode thereof is connected to the third node and a source electrode thereof is connected to the sixth inputting terminal. A first plate of the second capacitor is connected to the third node.

Optionally, a second plate of the second capacitor is connected to the fourth inputting terminal.

Optionally, the inputting unit includes a P type sixth transistor. A gate electrode of the sixth transistor is connected to the first inputting terminal, a source electrode thereof is connected to the second inputting terminal and a drain electrode thereof is connected to the second node.

Optionally, the outputting unit includes a P type seventh transistor. A gate electrode of the seventh transistor is connected to the first node, a source electrode thereof is connected to the eighth inputting terminal, and a drain electrode thereof is connected to the shift signal outputting terminal.

Optionally, the reset unit includes a P type eighth transistor and a third capacitor. A gate electrode of the eighth transistor is connected to the second node, a source electrode thereof is connected to the shift signal outputting terminal and a drain electrode thereof is connected to the ninth inputting terminal. A first plate of the third capacitor is connected to the second node.

Optionally, a second plate of the third capacitor is connected to the shift signal outputting terminal.

In a second aspect, the present disclosure provides a method for driving any of the above mentioned shift register units. The method includes: inputting low levels to the fifth inputting terminal, the seventh inputting terminal and the ninth inputting terminal, inputting high levels to the third inputting terminal and the eighth inputting terminal, and inputting clock signals to the first inputting terminal, the sixth inputting terminal and the fourth inputting terminal; wherein the clock signal input to the fourth inputting terminal is an inactive level for the first control module and the clock signal input to the sixth inputting terminal is a low level in the case that the clock signal input to the first inputting terminal is an active level for the inputting unit; the clock signal input to the first inputting terminal is an inactive level for the inputting unit and the clock signal input to the sixth inputting terminal is a high level in the case that the clock signal input to the fourth inputting terminal is an active level for the first control module; the active level for the inputting unit in the clock signal input to the first inputting terminal and the low level in the clock signal input to the sixth inputting terminal are synchronous, and a period of the active level for the inputting unit in the clock signal input to the first inputting terminal neither overlaps with nor connect to a period of the active level for the first control module in the clock signal input to the fourth inputting terminal; and starting to input a high-level shift pulse signal to the second inputting terminal in the case that the clock signal input to the first inputting terminal is the active level for the inputting unit, and stopping inputting the high-level shift pulse signal to the second inputting terminal in the case that the clock signal input to the first inputting terminal is at an $(N+1)^{th}$ inactive level for the inputting unit after starting to input the high-level shift pulse signal, where N is an integer equal to or larger than 1.

Optionally, the active level for the inputting unit is a low level and the active level for the first control module is a low level.

In a third aspect, the present disclosure provides a gate drive circuit, including multiple cascaded shift register units. Apart from a last-level shift register unit and a first-level shift register unit, a shift signal inputting terminal of a current-level shift register unit is connected to a shift signal outputting terminal of a previous-level shift register unit, and a shift signal outputting terminal of the current-level shift register unit is connected to a shift signal inputting terminal of a next-level shift register unit and a reset control signal inputting terminal of the previous-level shift register unit, and a shift signal inputting terminal of the first-level shift register unit is connected to an initial signal.

In a fourth aspect, the present disclosure provides a display device, including the above mentioned gate drive circuit.

DETAILED DESCRIPTION

Unless other definitions are given, technical terms or scientific terms used herein refer to normal meanings which may be understood by the ordinary skilled in the field to which the present disclosure relates. Terms such as "first" and "second" used in the specification and the list of claims of the present disclosure do not indicate any order, numbers or importance, and are merely used to distinguish different components. Similarly, terms such as "a" or "an" represent there exist at least one, rather than to limit the number. Terms such as "connected with" or "connected to" do not limit to physical or mechanical connections, and can include electrical connections which are either direct or indirect. Terms such as "on/above", "under/below", "left" and "right" are merely used to describe a relative position relationship; if the absolute position of one described object alters, the relative position relationship with respect to the described object alters correspondingly.

Implementations of the present disclosure are detailed in conjunction with drawings and embodiments. Following embodiments are merely for better clarifying technical solutions of the present disclosure and should not be used to limit protection scope of the present disclosure.

Figure 1:
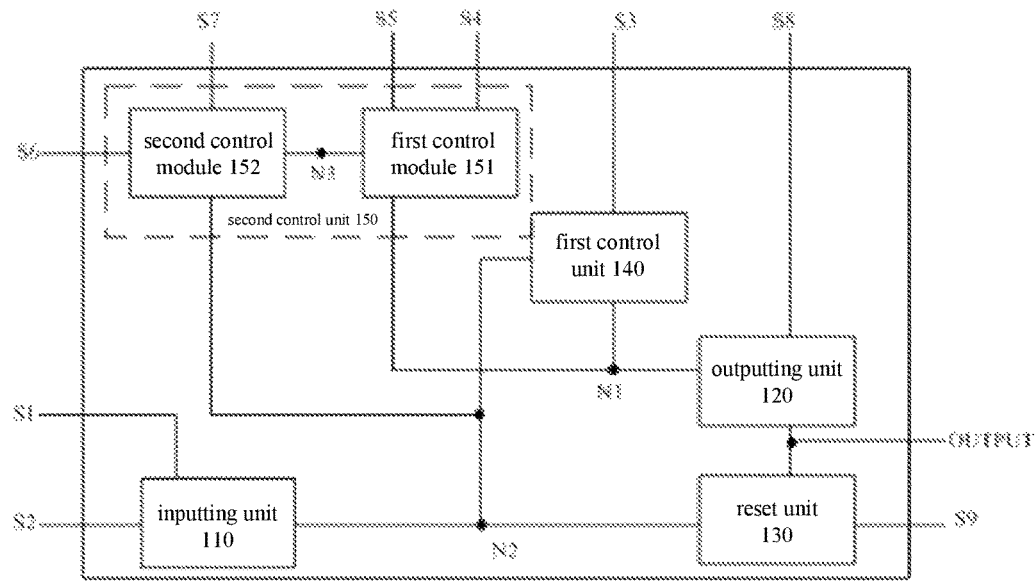
FIG. 1 is a schematic structural diagram of a shift register unit according to some embodiments of the present disclosure.

In a first aspect, the present disclosure provides a shift register unit. As shown in FIG. 1, the shift register unit includes: an inputting unit 110, an outputting unit 120, a reset unit 130, a first control unit 140 and a second control unit 150. The shift register unit further includes: a first node N1, a second node N2, a third node N3, a shift signal outputting terminal OUTPUT and inputting terminals S1-S9.

The inputting unit 110 is connected to a first inputting terminal S1, a second inputting terminal S2 and the second node N2, and is configured to set a level at the second node N2 identical to a level from the second inputting terminal S2 in the case that a level from the first inputting terminal S1 is an active level for the inputting unit 110 (a level that enables a connected transistor to be turned on, e.g., a low level).

The first control unit 140 is connected to a third inputting terminal S3, the first node N1 and the second node N2, and is configured to be turned on in the case that the second node N2 is at a low level and set a level at the first node N1 identical to a level from the third inputting terminal S3. The first control unit 140 is further configured to maintain the level at the first node N1 when the first node N1 is in a floating state.

The second control unit 150 includes a first control module 151 and a second control module 152. The first control module 151 is connected to a fourth inputting terminal S4, a fifth inputting terminal S5, the first node N1 and the third node N3. The first control module 151 is configured to be turned on in the case that the third node N3 is at a low level and a level from the fourth inputting terminal S4 is an active level for the first control module, and set a level at the first node N1 identical to a level from the fifth inputting terminal S5. The second control module 152 is connected to a sixth inputting terminal S6, a seventh inputting terminal S7, the second node N2 and the third node N3, and is configured to set a level at the third node N3 to be a high level in the case that the second node N2 is at a low level and a level from the sixth inputting terminal S6 is a high level, set the level at the third node N3 identical to a level from the seventh inputting terminal S7 in the case that the level from the sixth inputting terminal S6 is a low level, and maintain the level at the third node N3 when the third node N3 is in a floating state.

The outputting unit 120 is connected to the shift signal outputting terminal OUTPUT and an eighth inputting terminal S8, and is configured to be turned on in the case that the first node N1 is at a low level and set a level at the shift signal outputting terminal OUTPUT identical to a level from the eighth inputting terminal S8.

The reset unit 130 is connected to the second node N2, the shift signal outputting terminal OUTPUT and a ninth inputting terminal S9. The reset unit 130 is configured to set a level at the shift signal outputting terminal OUTPUT identical to a level from the ninth inputting terminal S9 in the case that the second node N2 is at a low level and maintain the level at the second node N2 when the second node N2 is in a floating state.

A width of a shift pulse output by the shift register unit in the present disclosure may be adjusted by adjusting a shift pulse input to the shift register unit, and a width of an output shift pulse signal is identical to a width of an input shift pulse signal. For a gate drive circuit generated by cascading such shift register units, the width of the pulse signal output by each stage of shift register unit may be adjusted by adjusting the width of an initial signal input to a first stage of shift register unit. The gate drive circuit may be used to drive a display device that requires a shift pulse with a relatively large width.

It may be easily understood that, a node is in a floating state means that the node is not connected to a current loop and electric charges at the node may not flow into the current loop.

In another aspect, the present disclosure provides a method for driving the above-described shift register unit.

The method includes steps of:

inputting low levels to the fifth inputting terminal S5, the seventh inputting terminal S7 and the ninth inputting terminal S9, inputting high levels to the third inputting terminal S3 and the eighth inputting terminal S8, and inputting clock signals to the first inputting terminal S1, the sixth inputting terminal S6 and the fourth inputting terminal S4; where the clock signal input to the fourth inputting terminal S4 is an inactive level for the first control module and the clock signal input to the sixth inputting terminal S6 is a low level in the case that the clock signal input to the first inputting terminal S1 is an active level for the inputting unit; the clock signal input to the first inputting terminal S1 is an inactive level for the inputting unit and the clock signal input to the sixth inputting terminal S6 is a high level in the case that the clock signal input to the fourth inputting terminal S4 is an active level for the first control module, the active level for the inputting unit in the clock signal input to the first inputting terminal S1 and the low level in the clock signal input to the sixth inputting terminal S6 are synchronous, and a period of the active level for the inputting unit in the clock signal input to the first inputting terminal S1 neither overlaps with nor connect to a period of the active level for the first control module in the clock signal input to the fourth inputting terminal S4; and starting to input a high-level shift pulse signal to the second inputting terminal S2 in the case that the clock signal input to the first inputting terminal S1 is the active level for the inputting unit, and stopping inputting the high-level shift pulse signal to the second inputting terminal S2 in the case that the clock signal input to the first inputting terminal is at an $(N+1)^{th}$ inactive level for the inputting unit after starting to input the shift pulse; where N is an integer equal to or larger than 1.

According to the method for driving the shift register unit provided in the present disclosure, the width of the output shift pulse may be adjusted by adjusting the value of N.

In implementation, low levels are constantly input to the fifth inputting terminal S5, the seventh inputting terminal S7 and the ninth inputting terminal S9. In actual application, two or three of the inputting terminals may be implemented as one inputting terminal. That is, the fifth inputting terminal S5 and the seventh inputting terminal S7 may be implemented as one inputting terminal, or fifth inputting terminal S5 and the ninth inputting terminal S9 may be implemented as one inputting terminal, or the seventh inputting terminal S7 and the ninth inputting terminal S9 may be implemented as one inputting terminal, or the fifth inputting terminal S5, the seventh inputting terminal S7 and the ninth inputting terminal S9 may be implemented as one inputting terminal. In this way, the quantity of signal lines used in the gate drive circuit may be reduced correspondingly. Similarly, the third inputting terminal S3 and the eighth inputting terminal S8 may be implemented as one terminal. Practically, the active level for the inputting unit 110 may be a low level, and in this case, the first inputting terminal S1 and the sixth inputting terminal S6 may be implemented as one inputting terminal. The quantity of signal lines to be used may be reduced with the above arrangements.

In implementation, the first control unit 140 includes a first transistor and a first capacitor. The first transistor is a P type transistor, having a source electrode connected to the third inputting terminal S3, a drain electrode connected to the first node N1 and a gate electrode connected to the second node N2. The first capacitor has a first plate connected to the first node N1. Furthermore, the first capacitor may have a second plate connected to the third inputting terminal S3 or the eighth inputting terminal S8. Practically, constant high levels are usually provided to the third inputting terminal S3 and the eighth inputting terminal S8; hence, a voltage at the second plate of the first capacitor may be maintained constant by connecting the second plate to the third inputting terminal S3 or the eighth inputting terminal S8, thereby preventing a voltage at the first plate of the first capacitor from changing.

In implementation, the first control module 151 may include a second transistor and a third transistor. The second transistor is a P type transistor, having a gate electrode connected to the third node N3, a drain electrode connected to the fifth inputting terminal S5 and a source electrode connected to a drain electrode of the third transistor. The third transistor has a gate electrode connected to the fourth inputting terminal S4 and a source electrode connected to the first node N1. Practically, the third transistor may be a P type transistor.

In implementation, the second control module 152 may include a fourth transistor and a fifth transistor that are both P type transistors, and a second capacitor. The fourth transistor has a gate electrode connected to the sixth inputting terminal S6 (which may be identical to the first inputting terminal S1), a drain electrode connected to the third node N3 and a source electrode connected to the seventh inputting terminal S7 (which may be identical to the fifth inputting terminal S5). The fifth transistor has a gate electrode connected to the second node N2, a drain electrode connected to the third node N3 and a source electrode connected to the sixth inputting terminal (which may be identical to the first inputting terminal S1). The second capacitor has a first plate connected to the third node N3. In other implementations, the second capacitor may further have a second plate connected to the fourth inputting terminal S4. When a high level is input to the fourth inputting terminal S4, a level at the third node N3 is further increased and the third node N3 may be maintained at a high level, such that the first control module 151 may be turned off.

In implementation, the inputting unit 110 may include a P type sixth transistor, having a gate electrode connected to the first inputting terminal S1, a source electrode connected to the second inputting terminal S2 and a drain electrode connected to the second node N2.

In implementation, the outputting unit 120 may include a P type seventh transistor, having a gate electrode connected to the first node N1, a source electrode connected to the eighth inputting terminal S8 (which may be identical to the third inputting terminal S3), and a drain electrode connected to the shift signal outputting terminal OUTPUT.

In implementation, the reset unit 130 may include a P type eighth transistor and a third capacitor. The eighth transistor has a gate electrode connected to the second node N2, a source electrode connected to the shift signal outputting terminal OUTPUT and a drain electrode connected to the ninth inputting terminal S9 (which may be identical to the fifth inputting terminal S5). The third capacitor has a first plate connected to the second node N2. Furthermore, the third capacitor may include a second plate connected to the shift signal outputting terminal OUTPUT. When the shift signal outputting terminal OUTPUT outputs a high level, a level at the second node N2 is further increased and may be maintained as a high level, such that the high level output by the shift signal outputting terminal OUTPUT may not be adversely affected.

It is easily understood that in implementation, the source electrode and the drain electrode of some of the above described transistors may be changed over. Any above-mentioned unit is not limited to its above-described structure. In some cases, a specific structure of some unit may be different from what described above, for example, the inputting unit may practically include multiple transistors. Specific structures of those units may not affect implementation of the present disclosure, and units in any structures that can achieve their corresponding functions should fall within the protection scope of the present disclosure.

It is easily understood that in implementation, descriptions about source electrodes and drain electrodes of the respective transistors are merely for easy comprehension. Practically, connections to the source electrode and the drain electrode of one transistor may be changed over. For example, the sixth transistor included in the inputting unit may have its drain electrode connected to the second inputting terminal S2 and have its source electrode connected to the second node N2. Changing over the connections of the source electrode and the drain electrode of each transistor should be regarded as equivalent replacements to corresponding technical features in the technical solution of the present disclosure, and corresponding solutions also fall within the protection scope of the present disclosure.

Figure 2:
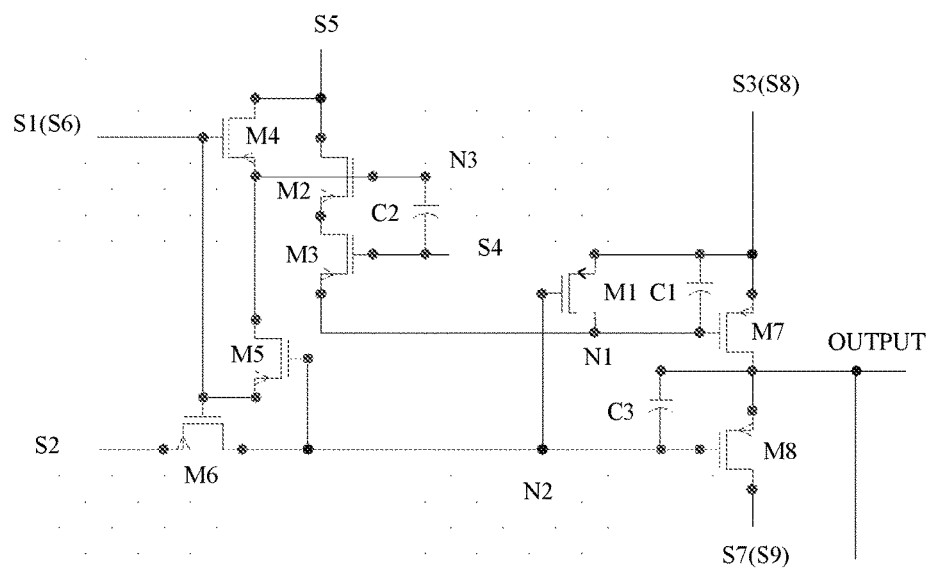
FIG. 2 is a schematic circuit diagram of a shift register unit according to some embodiments of the present disclosure.

A shift register unit and a method for driving the shift register unit are detailed hereinafter in conjunction with circuit diagrams and a sequence diagram showing levels of key signals and nodes when driving the shift register unit. It is supposed that, in the shift register unit, the first inputting terminal S1 and the sixth inputting terminal S6 are implemented as one inputting terminal and are both represented by S1 hereinafter, the third inputting terminal S3 and the eighth inputting terminal S8 are implemented as one inputting terminal and are both represented by S3 hereinafter, and the fifth inputting terminal S5, the seventh inputting terminal S7 and the ninth inputting terminal S9 are implemented as one inputting terminal and are all represented by S5 hereinafter. As shown in FIG. 2, the shift register unit includes eight P type transistors M1 to M8, three capacitors C1, C2 and C3, a first inputting terminal S1, a second inputting terminal S2, a third inputting terminal S3, a fourth inputting terminal S4, a fifth inputting terminal S5, a shift signal outputting terminal OUTPUT, and three nodes N1, N2 and N3. A drain electrode of the first transistor M1, a source electrode of the third transistor M3, a gate electrode of the seventh transistor M7 and a first plate of the first capacitor C1 are all connected to the first node N1. A gate electrode of the first transistor M1, a gate electrode of the eighth transistor M8, a gate electrode of the fifth transistor M5, a drain electrode of the sixth transistor M6 and a first plate of the third capacitor C3 are all connected to the second node N2. A drain electrode of the fourth transistor M4, a drain electrode of the fifth transistor M5, a gate electrode of the second transistor M2 and a first plate of the second capacitor C2 are all connected to the third node N3. A second plate of the capacitor C1, a source electrode of the first transistor M1 and a source electrode of the seventh transistor M7 are all connected to the third inputting terminal S3. A drain electrode of the seventh transistor M7, a source electrode of the eighth transistor M8 and a second plate of the third capacitor C3 are all connected to the shift signal outputting terminal OUTPUT. A source electrode of the second transistor M2 and a source electrode of the fourth transistor M4 are both connected to the fifth inputting terminal S5. A gate electrode of the fourth transistor M4, a gate electrode of the sixth transistor M6 and a source electrode of the fifth transistor M5 are all connected to the first inputting terminal S1. A source electrode of the third transistor M3 is connected to a drain electrode of the second transistor M2, and a gate electrode of the third transistor M3 is connected to the fourth inputting terminal S4.

Figure 3:
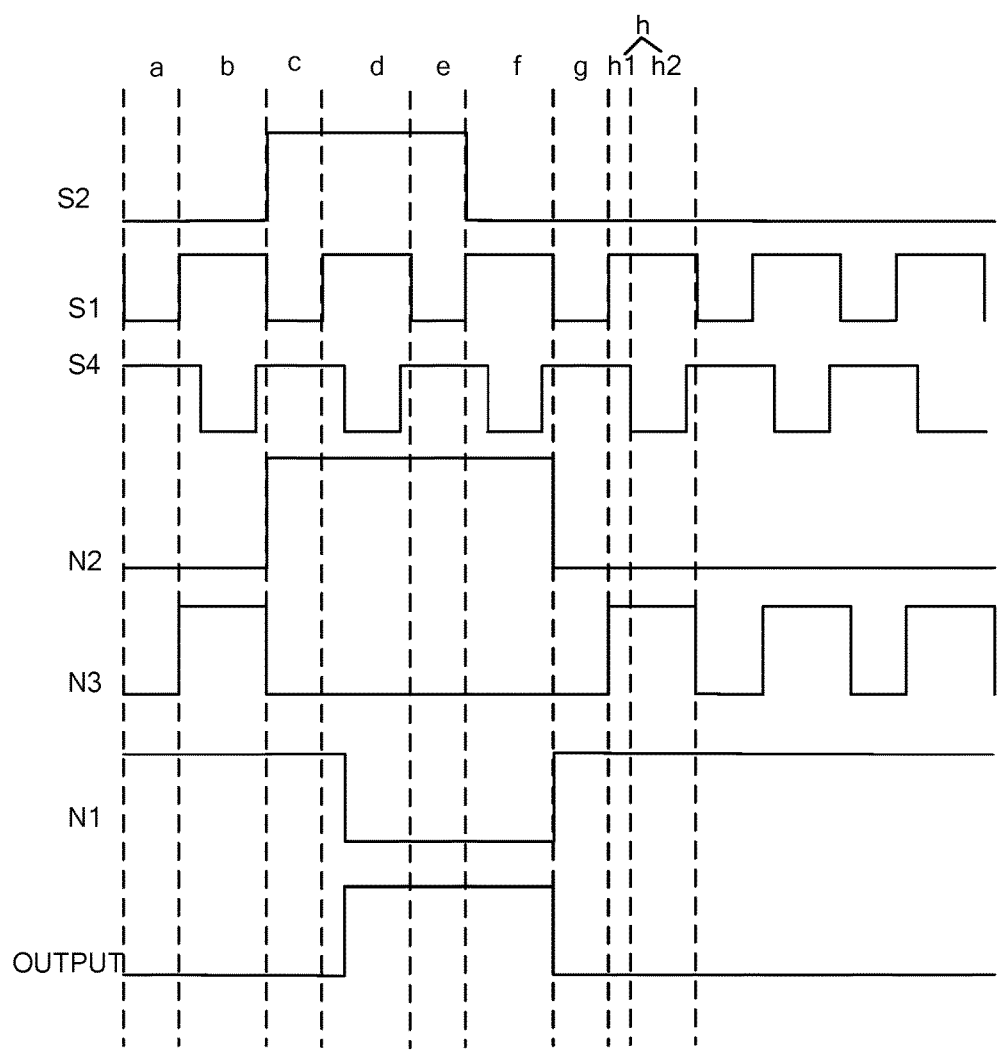
FIG. 3 is a sequence diagram showing levels of signals and nodes when driving the shift register unit shown in FIG. 2.

A width of a shift pulse signal output by the shift register unit as shown in FIG. 2 may be adjusted by adjusting a width of a shift pulse signal input to the shift register unit. A method for driving the shift register unit shown in FIG. 2 is detailed hereinafter in conjunction with FIG. 3. In one frame of driving process shown in FIG. 3, a first clock signal is applied to the first inputting terminal S1, a high level is applied to the third inputting terminal S3, a second clock signal is applied to the fourth inputting terminal S4, and a low level is applied to the fifth inputting terminal S5. When the first clock signal is at a low level, the second clock signal is at a high level; when the second clock signal is at a low level, the first clock signal is at a high level. Low levels of the first clock signal and low levels of the second clock signal do not overlap or connect to each other.

When the first clock signal is at a low level (stage c shown in FIG. 3), it is started to input a high-level shift pulse signal to the second inputting terminal S2. When the first clock signal comes to a second high level after the start of inputting the shift pulse signal, a low level is input to the second inputting terminal S2, i.e., the high-level shift pulse signal is stopped from being input to the second inputting terminal S2. In this way, an output shift pulse signal may have a width identical to that of the input shift pulse signal, such that each stage of a gate drive circuit formed by cascading the above-described shift register units can stably output high-level shift pulse signal.

At stage a, the first clock signal applied to the first inputting terminal S1 is at a low level, and the second clock signal applied to the fourth inputting terminal S4 is at a high level. The first inputting terminal is at a low level and the sixth transistor M6 is turned on accordingly. Since the second inputting terminal S2 is applied with a low level, the second node N2 is at a low level, such that the first transistor M1 is turned on and the first node N1 is connected to the third inputting terminal S3. Since S3 is applied with a constant high level, the first node N1 is at a high level and the seventh transistor M7 may not be turned on. In addition, since the second clock signal is at a high level, the third transistor M3 may not be turned on and the level at the first node N1 may not be pulled down.

At stage b, the first clock signal applied to the first inputting terminal S1 is at a high level, the sixth transistor M6 is turned off accordingly and the first node N2 is in a floating state. The third capacitor C3 maintains the second node N2 at a low level. The first transistor M1 is still turned on and the first node N1 is at a high level. The fifth transistor M5 is turned on such that the third node N3 is at a high level identical to that of the first inputting terminal S1; in this way, the second transistor M2 may not be turned on. Although the transistor M3 is turned on due to the low level input to the fourth inputting terminal S4, the first node N1 may not be connected to the fifth inputting terminal S5 and may not be at a low level.

At stage c, it is started to input a high-level shift pulse signal to the second inputting terminal S2. The first clock signal applied to the first inputting terminal S1 is at a low level, and the sixth transistor M6 and the fourth transistor M4 are both turned on. The second node N2 is connected to the second inputting terminal S2 and is pulled up to high level, and accordingly, the first transistor M1 and the fifth transistor M5 are turned off. The first clock signal applied to the first inputting terminal S1 is at a low level such that the fourth transistor M4 is turned on. Since S5 is always applied with low level, the third node N3 is pulled down to low level. High level is applied to the fourth inputting terminal S4 and the third transistor M3 is turned off. The node N1 is maintained at a high level by the first capacitor C1, and accordingly the seventh transistor M7 is not turned on and may not output high level.

At stage d, the first clock signal applied to the first inputting terminal S1 is at a high level and the high-level shift pulse signal is still applied to the second inputting terminal S2. The sixth transistor is still turned off and the second node N2 is still maintained at a high level; accordingly, the first transistor M1 and the fifth transistor M5 are both turned off. High level is input to the first inputting terminal S1 and the fourth transistor M4 is turned off. In this way, level at the third node N3 is not changed and maintained as low level by the capacitor C2, such that the second transistor M2 is turned on. The fourth inputting terminal S4 is applied with low level and the third transistor M3 is turned on accordingly, such that the first node N1 is pulled down to low level, the seventh transistor M7 is turned on and outputs high level.

At stage e, the first clock signal applied to the first inputting terminal S1 is at a low level and the second clock signal applied to the fourth inputting terminal S4 is at a high level. The high-level shift pulse signal is still applied to the second inputting terminal S2, and the sixth transistor M6 is turned on. The second node N2 is still at a high level such that the first transistor M1 is turned off and the level at the first node N1 may not be pulled up. Since the fourth inputting terminal S4 is at a high level, the third transistor M3 is turned off. Here, the seventh transistor M7 is still turned on and outputs a high-level shift pulse signal.

At stage f, the first clock signal applied to the first inputting terminal S1 is at a high level, and the high-level shift pulse signal is stopped from being input to the second inputting terminal S2, that is, a low level is applied to the second inputting terminal S2. The sixth transistor M6 is turned off and the second node N2 is still maintained at a high level, the first transistor N1 is still turned off. In this way, the first node N1 may not be pulled up to high level, the seventh transistor M7 is still turned on and outputs a high level.

At stage g, the first clock signal applied to the first inputting terminal S1 is at a low level, the second clock signal applied to the fourth inputting terminal S4 is at a high level, and the second inputting terminal S2 is applied with low level. Since the first inputting terminal S1 is at a low level, the sixth transistor M6 is turned on. Since the second inputting terminal S2 is applied with low level, the second node N2 is pulled down to low level and the first transistor M1 is accordingly turned on. The first node N1 is connected to the third inputting terminal S3. The first node N1 is pulled up to high level and the seventh transistor M7 is turned off. In addition, since the second clock signal applied to the fourth inputting terminal S4 is at a high level, the third transistor M3 may not be turned on and the first node N1 may not be pulled down to a low level.

Stage h may be divided into a first stage h1 and a second stage h2. At the first stage h1, the first clock signal applied to the first inputting terminal S1 and the second clock signal applied to the fourth inputting terminal S4 are both at a high levels. The sixth transistor M6 is turned off and the second node N2 is maintained at a low level and the fifth transistor M5 is accordingly turned on. Since the clock signal applied to the first inputting terminal S1 is at a high level, the third node N3 is pulled up to high level and the second transistor M2 is accordingly turned off. At the second stage h2, the first clock signal applied to the first inputting terminal S1 is at a high level and the second clock signal applied to the fourth inputting terminal S4 is at a low level. Here the fourth transistor M4 is turned off and the fifth transistor M5 is turned on, the third node N3 is connected to the first inputting terminal S1, such that the third node N3 is maintained at a high level and the second transistor M2 is turned off. Although the low level from the fourth inputting terminal S4 turns on the third transistor M3, the first node N1 may not be connected to the fifth inputting terminal S5m the first node N1 may not be pulled down to low level, and the seventh transistor M7 may not be turned on.

It can be seen from the above, a starting time point at which the seventh transistor M7 starts to output high level and an ending time point at which the seventh transistor M7 stops outputting high level are respectively half clock later than corresponding levels input to the second inputting terminal S2, where one clock includes a high-level pulse and a low-level pulse. In this way, the high-level shift pulse signal output by the shift register unit has a width identical to that of the high-level shift pulse signal input to the second inputting terminal S2. As long as high level is still input to the second inputting terminal S2 after stage c, the second node N2 may not be pulled down to a low level, the first transistor M1 may not be turned on and the first node N1 may not be pulled up to high level, and the seventh transistor M7 can output high level. Hence, the width of the shift pulse signal output by the shift register unit may be adjusted by adjusting the width of the shift pulse signal applied to the second inputting terminal S2. In embodiments of the present disclosure, all transistors are P type and may be manufactured by one process, thereby simplifying the manufacture process.

In a third aspect, the present disclosure further provides a gate drive circuit including multiple shift register units cascaded to each other. Each of the cascaded shift register units is the foregoing shift register unit. It is easily understood that in practical implementation, apart from a last-level shift register unit and a first-level shift register unit, a shift signal inputting terminal of a current-level shift register unit is connected to a shift signal outputting terminal of a previous-level shift register unit, so as to receive a shift signal output by a previous-level outputting unit. A shift signal outputting terminal of the current-level shift register unit is connected to a shift signal inputting terminal of a next-level shift register unit, so as to output a shift register unit signal to the next-level shift register unit. The shift signal outputting terminal of the current-level shift register unit is further connected to a reset control signal inputting terminal of the previous-level shift register unit, so as to reset the previous-level shift register unit. The first-level shift register unit may have a shift signal inputting terminal connected to an initial signal and other inputting terminals connected to corresponding signal lines.

In a fourth aspect, the present disclosure further provides a display device, including the foregoing gate drive circuit.

The width of a shift pulse output by the shift register unit in the present disclosure may be adjusted by adjusting a shift pulse input to the shift register unit, where the width of an output shift pulse signal is identical to that of an input shift pulse signal. For a gate drive circuit generated by cascading such shift register units, the width of a pulse signal output by each level of shift register unit may be adjusted by adjusting the width of an initial signal input to a first-level shift register unit. The gate drive circuit may be used to drive a display device that requires a shift pulse with a relatively large width.

The display device may be embodied as an electronic paper, a cell phone, a panel computer, a television, a display, a tablet computer, a digital image frame, a navigator and any product or component having a displaying function.

It is easily understood that the display device in the present disclosure may be a liquid crystal display device, or may be other types of display devices.

The disclosed embodiments are preferred embodiments of the present disclosure. It should be noted that, the ordinary skilled in the art can make various modifications and changes without departing from the principle and scope of the present disclosure, and all those modifications and changes fall within protection scope of the present disclosure.

What is claimed is:

1. A shift register unit, comprising an inputting unit, an outputting unit, a reset unit, a first control unit and a second control unit, a first node, a second node, a third node, a shift signal outputting terminal and a plurality of shift signal inputting terminals comprising a first inputting terminal, a second inputting terminal, a third inputting terminal, a fourth inputting terminal, a fifth inputting terminal, a sixth inputting terminal, a seventh inputting terminal, an eighth inputting terminal and a ninth inputting terminal, wherein the inputting unit is connected to the first inputting terminal, the second inputting terminal and the second node, and is configured to set a level at the second node identical to a level from the second inputting terminal in the case that a level from the first inputting terminal is an active level for the inputting unit;

the first control unit is connected to the third inputting terminal, the first node and the second node, and is configured to be turned on in the case that the second node is at a low level and set a level at the first node identical to a level from the third inputting terminal, and maintain the level at the first node when the first node is in a floating state;

wherein the second control unit comprises a first control module and a second control module;

the first control module is connected to the fourth inputting terminal, the fifth inputting terminal, the first node and the third node, and is configured to be turned on in the case that the third node is at the low level and a level from the fourth inputting terminal is an active level for the first control module, and set the level at the first node identical to a level from the fifth inputting terminal;

the second control module is connected to the sixth inputting terminal, the seventh inputting terminal, the second node and the third node, and is configured to set a level at the third node to be a high level in the case that the second node is at the low level and a level from the sixth inputting terminal is the high level, set the level at the third node identical to a level from the seventh inputting terminal in the case that the level from the sixth inputting terminal is the low level, and maintain the level at the third node when the third node is in the floating state;

wherein the outputting unit is connected to the shift signal outputting terminal and the eighth inputting terminal, and is configured to be turned on in the case that the first node is at the low level and set a level at the shift signal outputting terminal identical to a level from the eighth inputting terminal; and wherein the reset unit is connected to the second node, the shift signal outputting terminal and the ninth inputting terminal, and is configured to set the level at the shift signal outputting terminal identical to a level from the ninth inputting terminal in the case that the second node is at the low level, and maintain the level at the second node when the second node is in the floating state.

2. The shift register unit according to claim 1, wherein the first inputting terminal and the sixth inputting terminal are an identical inputting terminal, and the active level for the inputting unit is a low level.

3. The shift register unit according to claim 1, wherein the third inputting terminal and the eighth inputting terminal are an identical inputting terminal.

4. The shift register unit according to claim 1, wherein the fifth inputting terminal and the seventh inputting terminal are an identical inputting terminal.

5. The shift register unit according to claim 1, wherein the ninth inputting terminal and the fifth inputting terminal are an identical inputting terminal, or the ninth inputting terminal and the seventh inputting terminal are an identical inputting terminal.

6. The shift register unit according to claim 1, wherein the fifth inputting terminal, the seventh inputting terminal and the ninth inputting terminal are an identical inputting terminal.

7. The shift register unit according to claim 1, wherein the first control unit comprises a first transistor and a first capacitor; the first transistor is a P type transistor, a source electrode thereof is connected to the third inputting terminal, a drain electrode thereof is connected to the first node and a gate electrode thereof is connected to the second node; and a first plate of the first capacitor is connected to the first node.

8. The shift register unit according to claim 7, wherein a second plate of the first capacitor is connected to the third inputting terminal or the eighth inputting terminal.

9. The shift register unit according to claim 1, wherein the first control module comprises a second transistor and a third transistor;
the second transistor is a P type transistor, a gate electrode thereof is connected to the third node, a drain electrode thereof is connected to the fifth inputting terminal and a source electrode thereof is connected to a drain electrode of the third transistor; and
a gate electrode of the third transistor is connected to the fourth inputting terminal and a source electrode thereof is connected to the first node.

10. The shift register unit according to claim 9, wherein the third transistor is a P type transistor.

11. The shift register unit according to claim 1, wherein the second control module comprises a fourth transistor and a fifth transistor that are both P type transistors, and a second capacitor;
a gate electrode of the fourth transistor is connected to the sixth inputting terminal, a drain electrode thereof is connected to the third node and a source electrode thereof is connected to the seventh inputting terminal;
a gate electrode of the fifth transistor is connected to the second node, a drain electrode thereof is connected to the third node and a source electrode thereof is connected to the sixth inputting terminal; and
a first plate of the second capacitor is connected to the third node.

12. The shift register unit according to claim 11, wherein a second plate of the second capacitor is connected to the fourth inputting terminal.

13. The shift register unit according to claim 1, wherein the inputting unit comprises a P type sixth transistor;
a gate electrode of the sixth transistor is connected to the first inputting terminal, a source electrode thereof is connected to the second inputting terminal and a drain electrode thereof is connected to the second node.

14. The shift register unit according to claim 1, wherein the outputting unit comprises a P type seventh transistor;
a gate electrode of the seventh transistor is connected to the first node, a source electrode thereof is connected to the eighth inputting terminal, and a drain electrode thereof is connected to the shift signal outputting terminal.

15. The shift register unit according to claim 1, wherein the reset unit comprises a P type eighth transistor and a third capacitor;
a gate electrode of the eighth transistor is connected to the second node, a source electrode thereof is connected to the shift signal outputting terminal and a drain electrode thereof is connected to the ninth inputting terminal; and
a first plate of the third capacitor is connected to the second node.

16. The shift register unit according to claim 15, wherein a second plate of the third capacitor is connected to the shift signal outputting terminal.

17. A method for driving the shift register unit according to claim 1, comprising steps of:
inputting a low level to each of the fifth inputting terminal, the seventh inputting terminal and the ninth inputting terminal, inputting a high level to each of the third inputting terminal and the eighth inputting terminal, and inputting a clock signal to each of the first inputting terminal, the sixth inputting terminal and the fourth inputting terminal; wherein the clock signal input to the fourth inputting terminal is an inactive level for the first control module and the clock signal input to the sixth inputting terminal is the low level in the case that the clock signal input to the first inputting terminal is an active level for the inputting unit; the clock signal input to the first inputting terminal is an inactive level for the inputting unit and the clock signal input to the sixth inputting terminal is the high level in the case that the clock signal input to the fourth inputting terminal is an active level for the first control module; the active level for the inputting unit in the clock signal input to the first inputting terminal and the low level in the clock signal input to the sixth inputting terminal are synchronous, and a period of the active level for the inputting unit in the clock signal input to the first inputting terminal neither overlaps with nor connect to a period of the active level for the first control module in the clock signal input to the fourth inputting terminal; and
starting to input a high-level shift pulse signal to the second inputting terminal in the case that the clock signal input to the first inputting terminal is the active level for the inputting unit, and stopping inputting the high-level shift pulse signal to the second inputting terminal in the case that the clock signal input to the first inputting terminal is at an (N+1)th inactive level for the inputting unit after starting to input the high-level shift pulse signal; wherein N is an integer equal to or larger than 1.

18. The method according to claim 17, wherein the active level for the inputting unit is a low level and the active level for the first control module is the low level.

19. A gate drive circuit, comprising a plurality of shift register units according to claim 1 from a first-level shift register unit to a last-level shift register unit and connected in a cascaded manner, wherein apart from the last-level shift register unit and the first-level shift register unit, the shift signal inputting terminal of a current-level shift register unit is connected to the shift signal outputting terminal of a previous-level shift register unit, and the shift signal outputting terminal of the current-level shift register unit is connected to the shift signal inputting terminal of a next-level shift register unit, and the shift signal inputting terminal of the first-level shift register unit is connected to an initial signal.

20. A display device, comprising the gate drive circuit according to claim 19.

* * * * *